(12) United States Patent
Cho et al.

(10) Patent No.: US 7,611,964 B2
(45) Date of Patent: Nov. 3, 2009

(54) METHOD OF FORMING ISOLATION LAYER OF SEMICONDUCTOR MEMORY DEVICE

(75) Inventors: Jong Hye Cho, Seoul (KR); Whee Won Cho, Cheongju-si (KR); Eun Soo Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/163,584

(22) Filed: Jun. 27, 2008

(65) Prior Publication Data
US 2009/0170281 A1    Jul. 2, 2009

(30) Foreign Application Priority Data
Dec. 28, 2007   (KR) .................. 10-2007-140081

(51) Int. Cl.
*H01L 21/76* (2006.01)
(52) U.S. Cl. ................... 438/435; 257/E21.002
(58) Field of Classification Search .......... 438/435; 257/E21.002
See application file for complete search history.

(56) References Cited

U.S. PATENT DOCUMENTS

| | | | |
|---|---|---|---|
| 7,364,975 B2 * | 4/2008 | Culmsee et al. ............. 438/296 |
| 2006/0223321 A1 * | 10/2006 | Nam et al. .................. 438/694 |
| 2007/0243693 A1 * | 10/2007 | Nemani et al. .............. 438/424 |
| 2009/0035915 A1 * | 2/2009 | Su ............................. 438/424 |

\* cited by examiner

*Primary Examiner*—David S Blum
(74) *Attorney, Agent, or Firm*—Townsend and Townsend and Crew LLP

(57) ABSTRACT

The present invention relates to a method of forming an isolation layer of a semiconductor memory device. According to a method of fabricating a semiconductor memory device in accordance with an aspect of the present invention, a tunnel insulating layer and a charge trap layer are formed over a semiconductor substrate. An isolation trench is formed by etching the charge trap layer and the tunnel insulating layer. A passivation layer is formed on the entire surface including the isolation trench. A first insulating layer is formed at a bottom of the isolation trench. Portions of the passivation layer, which are oxidized in the formation process of the first insulating layer, are removed. A second insulating layer is formed on the entire surface including the first insulating layer.

20 Claims, 3 Drawing Sheets

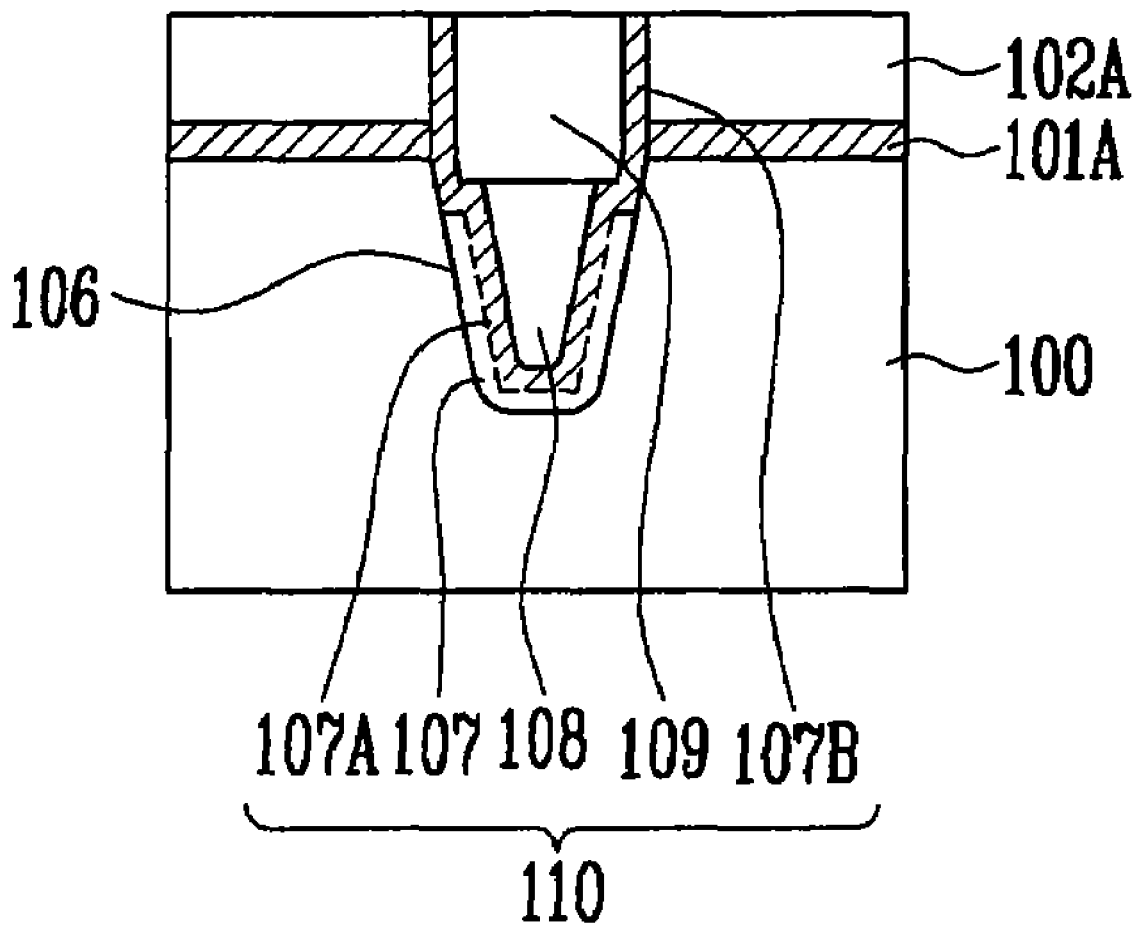

METHOD OF FORMING ISOLATION LAYER OF SEMICONDUCTOR MEMORY DEVICE

CROSS-REFERENCES TO RELATED APPLICATIONS

The present application claims priority to Korean patent application number 10-2007-140081, filed on Dec. 28, 2007, which is incorporated by reference in its entirety.

BACKGROUND OF THE INVENTION

The present invention relates to a method of forming an isolation layer of a semiconductor memory device and, more particularly, to a method of forming an isolation layer from a high-density plasma (HDP) oxide layer.

In a semiconductor circuit, it is necessary to isolate unit elements, such as transistors, diodes and resistors, which are formed over a semiconductor substrate. This isolation process is an initial process for the semiconductor fabrication process and determines the size of an active region and process margin of a subsequent process.

As a method of forming this isolation layer, a local oxidation of silicon (LOCOS) method has been used frequently. However, because of this LOCOS isolation method, oxygen penetrates into the sides of a pad oxide layer under a nitride layer used as a mask upon selective oxidization of a semiconductor substrate, so a bird's beak is generated at the corners of a field oxide layer. This bird's beak causes the field oxide layer to expand into the active region to a depth as long as the length of the bird's beak. Thus, the channel length is shortened and the threshold voltage is increased accordingly. Consequently, the electrical properties of, for example, a transistor is degraded.

Meanwhile, a shallow trench isolation (STI) process has emerged as an isolation process which can solve problems, such as unstable factors in the process, including degradation of the field oxide layer due to a reduction in the design rule of a semiconductor device, and a reduction of the active region due to the bird's beak.

FIG. 1 is a sectional view illustrating a conventional method of forming an isolation layer of a semiconductor memory device.

Referring to FIG. 1, a tunnel insulating layer 11 and a polysilicon layer 12 for a floating gate are formed over a semiconductor substrate 10. The polysilicon layer 12, the tunnel insulating layer 11, and the semiconductor substrate 10 are selectively etched to thereby expose an isolation region of the semiconductor substrate 10. Trenches 13 are formed by etching the exposed semiconductor substrate 10. The trenches 13 are gap-filled with an insulating layer, forming isolation layers (or isolation structures) 14.

Here, before the isolation layers 14 are formed, a series of processes, including a sidewall sacrificial oxidization process of the trenches 13 (for the purpose of removing etch defects on the semiconductor device due to a dry etch), a sidewall re-oxidization process of the trenches 13, etc., are performed. Description of the series of the processes is omitted for simplicity.

To increase the integration level of semiconductor memory devices, the device size has been reduced to 60 nm or less. Thus, for a semiconductor memory using the self-aligned shallow trench isolation (SA-STI) process, it becomes difficult to secure a gap-fill margin employing a HDP oxide layer. Accordingly, a spin on dielectric (SOD) oxide layer is used in order to secure sufficient gap-fill margin. However, if an isolation layer is formed using the SOD layer, the process costs are increased and the reliability of elements is degraded due to the physical properties of the SOD layer.

BRIEF SUMMARY OF THE INVENTION

The present invention relates to a method of forming an isolation layer (or isolation structure) of a semiconductor memory device, in which a passivation layer is formed within an isolation trench of semiconductor elements and the isolation trench is gap-filled with a HDP layer using a deposition etch deposition (DED) method in order to form an isolation layer, so that process expenses can be saved and reliability of elements can be improved.

A method of forming an isolation layer of a semiconductor memory device in accordance with an aspect of the present invention includes forming a tunnel insulating layer and a charge trap layer over a semiconductor substrate, forming an isolation trench by etching the charge trap layer and the tunnel insulating layer, forming a passivation layer on the entire surface including the isolation trench, forming a first insulating layer at a bottom of the isolation trench, removing portions of the passivation layer, which are oxidized in the formation process of the first insulating layer, and forming a second insulating layer on the entire surface including the first insulating layer.

The passivation layer can be formed of a nitride layer.

The first insulating layer and the second insulating layer can be formed of a HDP oxide layer. The first insulating layer can be formed using a DED method in which a deposition process, an etch process, and a deposition process are repeatedly performed.

The deposition process can be performed using a $SiH_4$ gas and an $O_2$ gas. The etch process can be performed using a dry etch method or a wet etch method, the dry etch method can be performed using a remote plasma method employing an $NF_3$ gas, and the wet etch process can be performed using an etchant containing $NF_3$ and HF.

After the first insulating layer is formed, an annealing process employing an oxygen gas can be performed.

The removal of the oxidized portions of the passivation layer can be performed using an etching containing $H_2SO_4$.

BRIEF DESCRIPTION OF THE DRAWINGS

FIGS. 2 to 6 are sectional views illustrating a method of forming an isolation layer of a semiconductor memory device in accordance with an embodiment of the present invention.

DESCRIPTION OF SPECIFIC EMBODIMENTS

A specific embodiment according to the present invention will be described with reference to the accompanying drawings. However, the present invention is not limited to the disclosed embodiment, but may be implemented in various manners. The embodiment is provided to complete the disclosure of the present invention and to allow those having ordinary skill in the art to understand the scope of the present invention. The present invention is defined by the category of the claims.

FIGS. 2 to 5 are sectional views illustrating a method of forming an isolation layer (or isolation structure) of a semiconductor memory device in accordance with an embodiment of the present invention.

Figure 1:
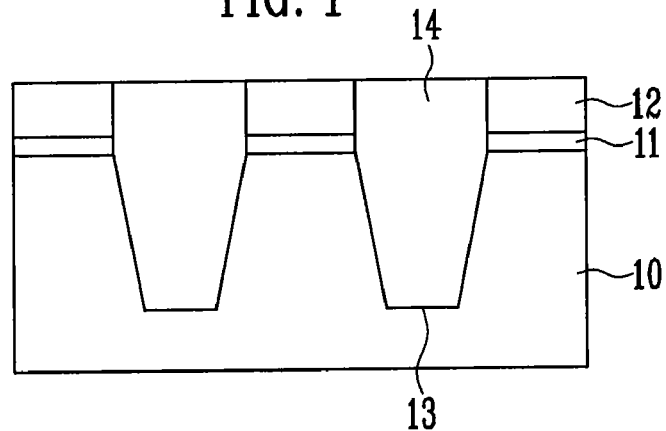
FIG. 1 is a sectional view illustrating a conventional method of forming an isolation layer of a semiconductor memory device.
Figure 2:
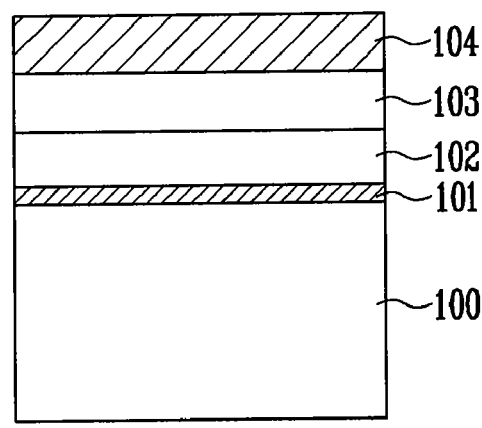

Referring to FIG. 2, a tunnel insulating layer 101, a charge trap layer 102, a first hard mask layer 103, and a second hard mask layer 104 are sequentially formed over a semiconductor substrate 100. The charge trap layer 102 can be formed of a polysilicon layer or a nitride layer in which electric charges can be trapped and charged. The polysilicon layer can have a dual layer, consisting of an amorphous polysilicon layer not containing impurities (or undoped amorphous polysilicon layer) and a polysilicon layer containing impurities (or doped polysilicon).

Figure 3:
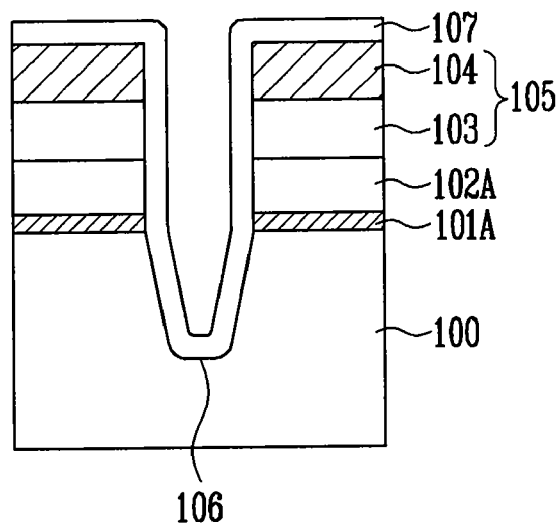

Referring to FIG. 3, the first hard mask layer 103 and the second hard mask layer 104 are patterned by an etch process. A hard mask pattern 105 is formed. A charge trap layer 102A and a tunnel insulating layer 101A are etched by an etch process using the hard mask pattern 105 as an etch mask to expose a portion of the semiconductor substrate 100. The etched process used to expose the substrate is a different etch process than that used to form the hard mask pattern 105 in the present embodiment. In another embodiment, the same etch process may be used. The exposed portion of the substrate is defined within an isolation region wherein an isolation structure is to be formed.

An isolation trench 106 is formed by etching the exposed semiconductor substrate 100.

Next, a passivation layer 107 is formed on the entire surface including the isolation trench 106. The passivation layer is used to protect the charge trap layer during the formation of the isolation layers. The passivation layer 107 can be formed of a nitride layer. The passivation layer 107 can be formed to a thickness of 200 to 300 angstroms (e.g., 250 angstroms).

Here, before the passivation layer 107 is formed, an oxidization process can be performed in order to repair the damages made to the substrate during the etch process to form the isolation trench 106.

Figure 4:
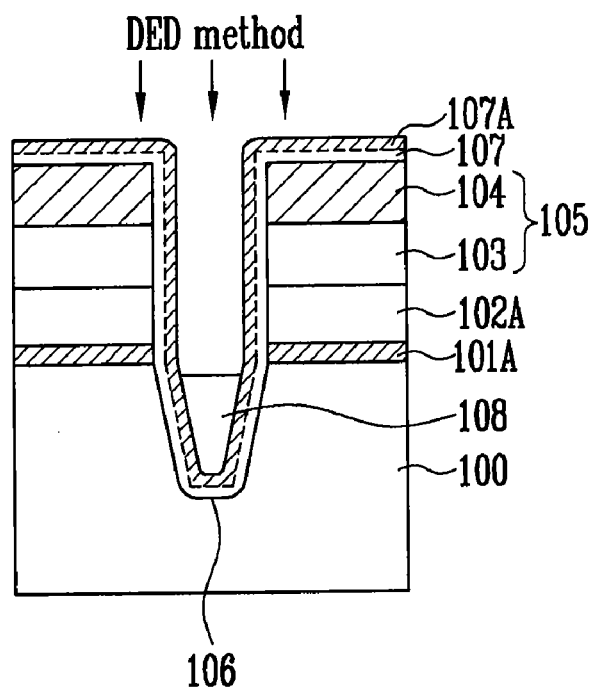

Referring to FIG. 4, a first insulating layer 108 is formed at the bottom of the isolation trench 106. The first insulating layer 108 is an insulating layer formed using a high-density plasma (HDP) process. The HDP process is used in a deposition-etch-deposition (DED) method, in which a deposition process, an etch process, and a deposition process are performed in sequence repeatedly. In one embodiment, exposed portions of the passivation layer 107A are oxidized during the formation of the first insulating layer 108 (or the HDP insulating layer), where the HDP process involves forming an oxide.

In the present embodiment, the DED method is performed by depositing the HDP insulating layer, performing an etch process to remove overhung portions of the trench aperture, and then depositing another HDP insulating layer. The deposition process is performed using a $SiH_4$ gas and an $O_2$ gas. Here, the etch process can be performed using a dry or wet method. The dry etch method is performed using a remote plasma method employing a $NF_3$ gas, and the wet etch process is performed using an etchant containing $NF_3$ and HF. In the present embodiment, the charge trap layer 102A is protected from the fluorine (F) residues from the etch process by the passivation layer 107A provided against the sidewalls of the charge trap layer 102A.

After the completion of the DED method, the first insulation layer 108 is formed at the bottom portion of the isolation trench, as shown in FIG. 4. The first insulation layer 108 exposes an upper portion of the passivation layer 107A since the first insulation layer 108 only fills part of the isolation trench 106. In one embodiment, the first insulation layer 108 fills no more than ⅓ of the depth of the isolation trench in the present embodiment. In another embodiment, the first insulation layer 108 fills no more than ½ of the depth of the isolation trench 106. In yet another embodiment, the upper surface of the first insulation layer 108 is at or below the upper surface of the semiconductor substrate 100.

In the present embodiment, an annealing process is performed in an oxygen environment to further oxidize the oxidized passivation layer 107A and to cure the first insulating layer 108.

Figure 5:
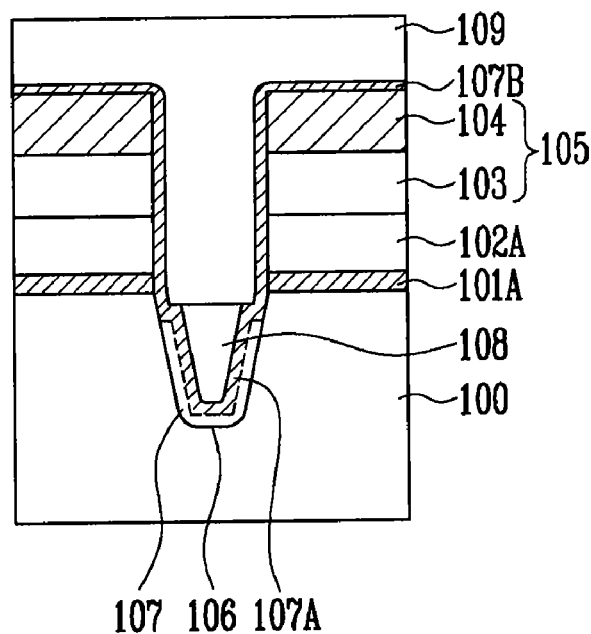

Referring to FIG. 5, the oxidized passivation layer 107A is etched. An etched passivation layer 107 is obtained. The etched passivation layer 107 has a wider opening than the oxidized passivation layer 107A. In the present embodiment, the thickness of the etched passivation layer 107 is reduced by the etch step, but the passivation layer 107 remains on the sidewalls of the isolation trench 106 and coating the isolation trench 106. The etch process is performed using an etchant containing $H_2SO_4$ in the present embodiment. The wider opening of the 107 enables a subsequent gap-filling step to be performed more effectively.

Thereafter, a second insulating layer 109 is formed on the entire surface including the passivation layer 107B. The second insulating layer 109 can be formed of a HDP oxide layer. The process of forming the second insulating layer 109, the passivation layer 107B remaining on the sidewalls of the charge trap layer 102A is oxidized. Due to this, a problem in which electric charges are trapped when elements are driven is not generated.

Referring to FIG. 6, a polishing process is performed to remove the second insulating layer 109, the passivation layer 107B and the hard mask pattern 105 until the surface of the charge trap layer 102A is exposed. An isolation structure 110 including the second insulating layer 109, the first insulating layer 108 and the passivation layers 107, 107A and 107B is obtained within the isolation trench 106, as shown in FIG. 6.

As described above, according to the present invention, the passivation layer is formed within the isolation trench of semiconductor elements and the isolation trench is then gap-filled with the HDP layer using the DED method, thus forming the isolation layer. Accordingly, process costs can be saved and reliability of elements can be improved.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of fabricating a semiconductor memory device, the method comprising:

forming a tunnel insulating layer and a charge trap layer over a semiconductor substrate;

forming an isolation trench by etching the charge trap layer, the tunnel insulating layer, and the semiconductor substrate;

forming a passivation layer over the charge trap layer and within the isolation trench, the passivation layer coating the isolation trench;

forming a first insulating layer at a bottom portion of the isolation trench, the first insulating layer exposing an portion of the passivation layer, the exposed portion of the passivation layer having been oxidized during the formation of the first insulation layer;

etching the exposed portion of the passivation layer to reduce a thickness of the exposed portion of the passivation layer; and forming a second insulating layer at least within the isolation trench and over the first insulation layer to form an isolation structure including the first and second insulation layers.

2. The method of claim 1, wherein a height of the first insulating layer is no more than ½ of a height of the isolation trench.

3. The method of claim 1, wherein the passivation layer includes nitride.

4. The method of claim 1, wherein the first insulating layer and the second insulating layer are oxide layers, each formed using a high-density plasma (HDP) process.

5. The method of claim 1, wherein the first insulating layer is formed using a deposition-etch-deposition (DED) method in which a deposition process, an etch process, and a deposition process are repeated in sequence.

6. The method of claim 5, wherein the deposition process is performed using a $SiH_4$ gas and an $O_2$ gas.

7. The method of claim 5, wherein the etch process of the DED method is performed using a remote plasma method employing an NF3 gas.

8. The method of claim 5, wherein the etch process is performed using an etchant containing $NF_3$ and HF.

9. The method of claim 1, further comprising:
performing an annealing process in oxygen environment after the first insulating layer is formed.

10. The method of claim 1, wherein the etching of the exposed portion of the passivation layer is performed using an etchant including $H_2SO_4$.

11. The method of claim 1, wherein the passivation layer is formed to a thickness of 200 to 300 angstroms.

12. A method of fabricating a semiconductor memory device, the method comprising:
forming a tunnel insulating layer over a semiconductor layer and a charge trap layer over the tunnel insulating layer;
forming an isolation trench by etching the charge trap layer, the tunnel insulating layer, and the semiconductor substrate;
forming a passivation layer on the entire surface including the isolation trench, the passivation layer coating the isolation trench;
forming a first insulating layer within the isolation trench, the first insulating layer filling the a bottom portion of the isolation trench and exposing a portion of the passivation layer that is coating an upper portion of the isolation trench;
partly etching the exposed portion of the passivation layer; and
forming a second insulating layer at least within the isolation trench and over the first insulating layer, wherein the passivation layer formed on sidewalls of the charge trap layer is oxidized during the formation of the second insulating layer.

13. The method of claim 12, wherein the passivation layer includes a nitride layer, wherein the passivation layer is oxidized during the formation of the second insulating layer.

14. The method of claim 12, wherein the first insulating layer and the second insulating layer each is formed of a high-density plasma (HDP) oxide layer.

15. The method of claim 12, wherein the first insulating layer is formed using a deposition-etch-deposition (DED) method in which a deposition process, an etch process, and a deposition process are repeated in sequence.

16. The method of claim 15, wherein the deposition process of the DED method is performed using a $SiH_4$ gas and an $O_2$ gas.

17. The method of claim 15, wherein the etch process of the DED method is performed using a remote plasma method employing an $NF_3$ gas or an etchant containing $NF_3$ and HF.

18. The method of claim 12, further comprising:
after the first insulating layer is formed, performing an annealing process employing an oxygen gas.

19. The method of claim 1, wherein the exposed portion of the passivation layer is etched using an etchant containing $H_2SO_4$.

20. The method of claim 12, wherein the passivation layer is formed to a thickness of 200 to 300 angstroms.

* * * * *